(12) United States Patent
Doi et al.

(10) Patent No.: US 7,195,546 B2
(45) Date of Patent: Mar. 27, 2007

(54) POLISHING APPARATUS AND METHOD OF POLISHING WORK PIECE

(75) Inventors: Toshiro Doi, 3-2970-53, Mihara-cho, Tokorozawa-shi, Saitama (JP) 359-0045; Ara Philipossian, Tucson, AZ (US); Darren DeNardis, Tucson, AZ (US)

(73) Assignees: Toshiro Doi, Tokorozawa (JP); Fujikoshi Machinery Corp., Nagano (JP)

( * ) Notice: Subject to any disclaimer, the term of this patent is extended or adjusted under 35 U.S.C. 154(b) by 0 days.

(21) Appl. No.: 11/443,390

(22) Filed: May 30, 2006

(65) Prior Publication Data

US 2006/0217039 A1 Sep. 28, 2006

Related U.S. Application Data

(62) Division of application No. 10/992,283, filed on Nov. 18, 2004, now Pat. No. 7,070,486.

(30) Foreign Application Priority Data

Nov. 20, 2003 (JP) ............................. 2003-390677
Nov. 20, 2003 (JP) ............................. 2003-390692

(51) Int. Cl.
*B24B 1/00* (2006.01)
(52) U.S. Cl. ............................. 451/60; 451/41; 451/285
(58) Field of Classification Search ................ 451/8, 451/41, 60, 65, 285–289; 438/691–693
See application file for complete search history.

(56) References Cited

U.S. PATENT DOCUMENTS

| 5,348,615 A | 9/1994 | Gupta |
| 5,618,177 A | 4/1997 | Abbott |
| 5,637,185 A | 6/1997 | Murarka et al. |
| 5,817,245 A | 10/1998 | Iwamoto et al. |
| 6,007,406 A | 12/1999 | Custer et al. |

(Continued)

FOREIGN PATENT DOCUMENTS

EP 1 316 393 6/2003

(Continued)

OTHER PUBLICATIONS

U.S. Appl. No. 10/303,156, filed Nov. 22, 2002, Doy.

*Primary Examiner*—Dung Van Nguyen
(74) *Attorney, Agent, or Firm*—Jordan and Hamburg LLP

(57) ABSTRACT

The polishing apparatus is capable of changing a pH value of slurry to adjust polishing rate and polishing a work piece with high flatness. The polishing apparatus comprises: a pressure vessel; a polishing plate provided in the pressure vessel; a pressing plate pressing a work piece onto the polishing plate; a driving unit relatively moving the polishing plate with respect to the pressing plate so as to polish the work piece; a gas supplying source supplying an alkaline gas or an acid gas into the pressure vessel; a gas discharging section discharging the supplied gas from the pressure vessel; and a slurry supplying unit supplying slurry onto the polishing plate. A pH value of the slurry is adjusted by dissolving the alkaline gas or the acid gas in the slurry.

4 Claims, 10 Drawing Sheets

U.S. PATENT DOCUMENTS

| | | |
|---|---|---|
| 6,261,406 B1 | 7/2001 | Jurgensen et al. |
| 6,623,355 B2 * | 9/2003 | McClain et al. ............... 451/41 |
| 6,896,590 B2 * | 5/2005 | Minamihaba et al. ......... 451/41 |
| 7,070,486 B2 * | 7/2006 | Doi et al. ..................... 451/60 |
| 2002/0055323 A1 | 5/2002 | McClain et al. |

FOREIGN PATENT DOCUMENTS

| | | |
|---|---|---|
| JP | 2003-225859 | 8/2003 |
| WO | WO- 00/18544 | 4/2000 |
| WO | WO- 02/38335 | 5/2002 |

* cited by examiner

POLISHING APPARATUS AND METHOD OF POLISHING WORK PIECE

This is a Divisional, of application Ser. No. 10/992,283 filed Nov. 18, 2004, now U.S. Pat. 7,070,486.

BACKGROUND OF THE INVENTION

The present invention relates to a polishing apparatus and a method of polishing a work piece, e.g., silicon wafer.

In conventional polishing apparatuses for polishing work pieces, e.g., silicon wafers, atmospheric conditions of the apparatuses or their polishing sections, e.g., pressure, temperature, humidity, are not specially controlled. Therefore, especially in chemical-mechanical polishing apparatuses, stable machining characteristics cannot be gained. To solve the problem, the inventors of the present invention have invented a pressure vessel type polishing apparatus, which has a pressure vessel whose atmosphere can be controlled (see Japanese Patent Gazette No. 2003-225859). The polishing apparatus is capable of improving polishing efficiency.

In case of chemical-mechanical polishing, a pH value of slurry greatly influences polishing rate and quality of products. In a conventional open-type polishing apparatus, a pH value of slurry delicately changes according to the atmospheric conditions. Therefore, it is difficult to precisely control the pH value of the slurry.

Further, in the case of chemical-mechanical polishing, it usually takes 2–7 minutes to gain normal machining characteristics after dressing a polishing pad. After dressing the polishing pad, a surface of the polishing pad is cleaned by pure water, so it takes a long time to completely remove used slurry therefrom. Especially, in case of changing to different type slurry during the chemical-mechanical polishing process, it takes 10 minutes or more to completely exchange slurry.

Especially, in the pressure vessel type polishing apparatus, polishing conditions must be rapidly changed without exchanging slurry.

SUMMARY OF THE INVENTION

An object of the present invention is to provide a pressure vessel type polishing apparatus, which is capable of changing a pH value of slurry to adjust polishing rate and polishing a work piece with high flatness, and a method of polishing a work piece with the polishing apparatus.

Another object is to provide a pressure vessel type polishing apparatus, which is capable of suitably coping with different polishing conditions without exchanging slurry, and a method of polishing a work piece with the polishing apparatus.

To achieve the object, the present invention has following structures.

Namely, a first basic structure of the polishing apparatus of the present invention comprises:

a pressure vessel having a lid which opens or closes the pressure vessel;

a polishing plate being provided in the pressure vessel;

a pressing plate being provided on the polishing plate, the pressing plate pressing a work piece, which has been set between the polishing plate and the pressing plate, onto the polishing plate;

a driving unit relatively moving the polishing plate with respect to the pressing plate so as to polish the work piece;

a gas supplying source being connected to the pressure vessel, the gas supplying source supplying an alkaline gas or an acid gas into the pressure vessel;

a gas discharging section discharging the supplied gas from the pressure vessel; and a slurry supplying unit supplying slurry onto the polishing plate, wherein a pH value of the slurry is adjusted by dissolving the alkaline gas or the acid gas in the slurry.

A second basic structure of the polishing apparatus comprises:

a pressure vessel having a lid which opens or closes the pressure vessel;

a polishing plate being provided in the pressure vessel;

a pressing plate being provided on the polishing plate, the pressing plate pressing a work piece, which has been set between the polishing plate and the pressing plate, onto the polishing plate;

a driving unit relatively moving the polishing plate with respect to the pressing plate so as to polish the work piece;

a gas supplying source being connected to the pressure vessel, the gas supplying source supplying an alkaline gas or an acid gas into the pressure vessel;

a gas discharging section discharging the supplied gas from the pressure vessel; and a pure water supplying unit supplying pure water onto the polishing plate, wherein a pH value of the pure water is adjusted by dissolving the alkaline gas or the acid gas in the pure water so as to use the pure water as slurry.

A first method of polishing a work piece, in a polishing apparatus comprising: a pressure vessel having a lid which opens or closes the pressure vessel; a polishing plate being provided in the pressure vessel; a pressing plate being provided on the polishing plate, the pressing plate pressing a work piece, which has been set between the polishing plate and the pressing plate, onto the polishing plate; a driving unit relatively moving the polishing plate with respect to the pressing plate so as to polish the work piece; a gas supplying source being connected to the pressure vessel, the gas supplying source supplying an alkaline gas or an acid gas into the pressure vessel; a gas discharging section discharging the supplied gas from the pressure vessel; and a slurry supplying unit supplying slurry onto the polishing plate, comprises the step of:

supplying the alkaline gas or the acid gas into the pressure vessel from the gas supplying source so as to adjust the pH value of the slurry.

A second method of polishing a work piece, in a polishing apparatus comprising: a pressure vessel having a lid which opens or closes the pressure vessel; a polishing plate being provided in the pressure vessel; a pressing plate being provided on the polishing plate, the pressing plate pressing a work piece, which has been set between the polishing plate and the pressing plate, onto the polishing plate; a driving unit relatively moving the polishing plate with respect to the pressing plate so as to polish the work piece; a gas supplying source being connected to the pressure vessel, the gas supplying source supplying an alkaline gas or an acid gas into the pressure vessel; a gas discharging section discharging the supplied gas from the pressure vessel; and a pure water supplying unit supplying pure water onto the polishing plate, comprises the step of:

supplying the alkaline gas or the acid gas into the pressure vessel from the gas supplying source so as to adjust the pH value of the pure water and use the pure water as slurry.

In the polishing apparatus and the method of the present invention, the polishing apparatus is capable of suitably and rapidly coping with various polishing conditions without exchanging slurry in the pressure vessel. Therefore, various types of polishing can be efficiently performed in the polishing apparatus.

BRIEF DESCRIPTION OF THE DRAWINGS

Embodiments of the present invention will now be described by way of examples and with reference to the accompanying drawings, in which:

FIGS. 14–17 are sectional views, which show a process of implanting copper cables in a substrate, wherein FIG. 14 shows a state in which an outermost copper layer is not polished, FIG. 15 shows a state in which the outermost copper layer is polished toward a barrier metal layer, FIG. 16 shows a state in which top parts of the barrier metal layer are exposed, and FIG. 17 shows a state in which the top parts of the barrier metal layer are removed;

FIGS. 18–21 are sectional views, which show a process of polishing a $SiO_2$ film formed on copper cables, wherein FIG. 18 shows a state in which the $SiO_2$ film is not polished, FIG. 19 shows a state in which the $SiO_2$ film is polished toward stop layers, FIG. 20 shows a state in which the stop layers are exposed, and FIG. 21 shows a state in which the stop layers are removed.

DETAILED DESCRIPTION OF THE EMBODIMENTS

Preferred embodiments of the present invention will now be described in detail with reference to the accompanying drawings.

Figure 1:
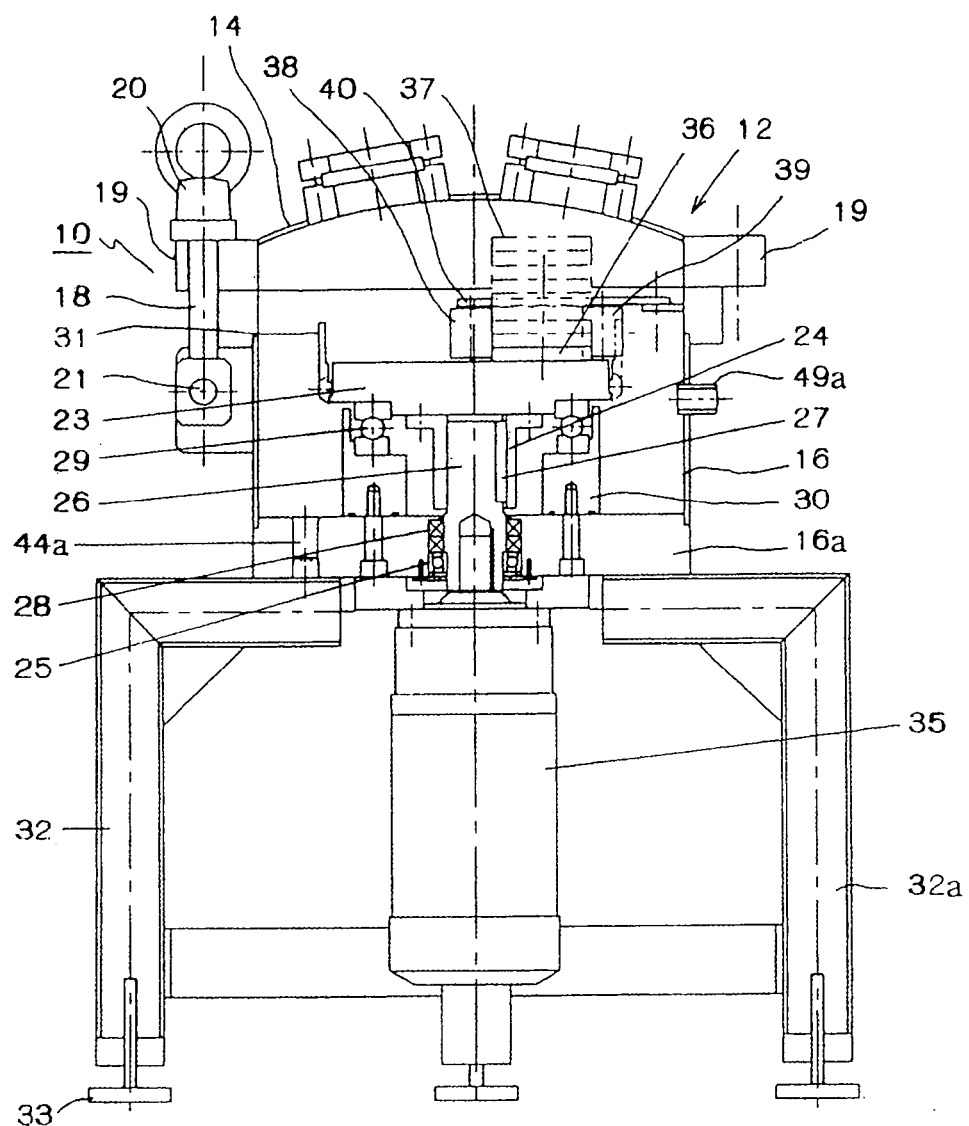
FIG. 1 is a front view of a polishing apparatus of an embodiment of the present invention.
Figure 2:
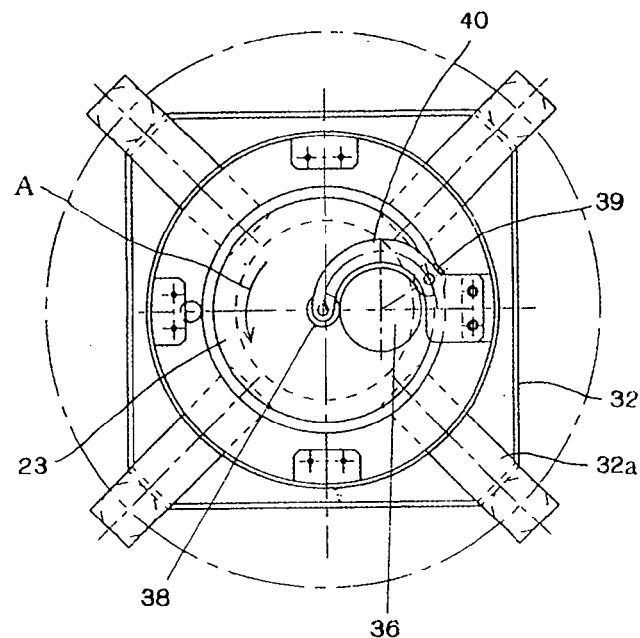
FIG. 2 is a plan view of the polishing apparatus, in which a lid is opened.
Figure 3:
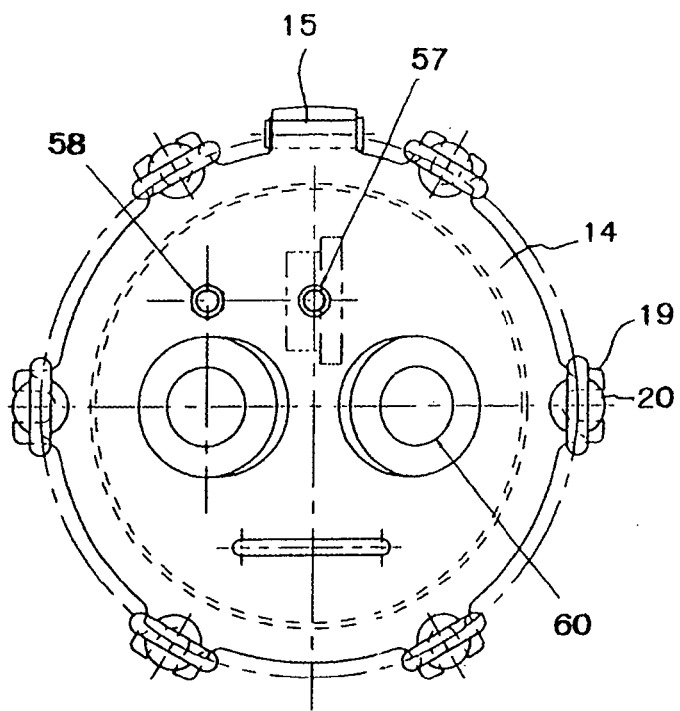
FIG. 3 is a plan view of a bell jar.

FIG. 1 is a front sectional view of a polishing apparatus 10 of an embodiment of the present invention; FIG. 2 is a plan view of the polishing apparatus, in which a lid is opened; and FIG. 3 is a plan view of a bell jar.

The bell jar 12 has a lid 14 and acts as a pressure vessel capable of bearing increase and reduce of pressure therein.

The lid 14 is pivotably attached to a body proper 16 of the bell jar 12 by a shaft 15 so as to open and close the body proper 16.

A lower end of a clamping bolt 18 is pivotably attached to the body proper 16 by a shaft 21; an upper end of the bolt 18 is capable of entering a gap between U-shaped forks of a fixed arm 19. By turning a nut 20, the lid 14 can air-tightly close the body proper 16. In the present embodiment, six clamping bolts 18 are provided with angular separations of 60 degrees.

The body proper 16 is made of steel having a prescribed thickness and formed into a bottomed cylindrical shape. A top plate of the lid 14 is curved upward. With this pressure-resisting structure, the bell jar 12 can act as the pressure vessel. A bottom section 16a of the body proper 16 is a flat plate, and its thickness is much thicker than that of a cylindrical section so as to bear inner pressure.

Note that, the shape of the bell jar 12 is not limited to the cylindrical shape. Other pressure vessels which have enough pressure-resisting structure can be employed in the present invention.

A polishing plate 23 is provided in the bell jar 12.

A polishing cloth or a polishing pad (not shown), which is made of a known material, is adhered on an upper face of the polishing plate 23.

A connecting member 24, which is formed into a cylindrical shape, is fixed on a bottom face of the polishing plate 23. The connecting member 24 is connected to a rotary shaft 26, which is rotatably held by a bearing 25 of the bottom section 16a, by a key 27. With this structure, the polishing plate 23 is rotated together with the rotary shaft 26. A symbol 28 stands for a sealing member.

A lower end part of the polishing plate 23 is supported by a thrust bearing 29. A supporting member 30 is provided on the bottom section 16a, and the thrust bearing 29 is provided on the supporting member 30.

A cover 31 encloses an outer circumferential face of the polishing plate 23 so as to remain prescribed amount of slurry on the polishing plate 23. Note that, the cover 31 may be omitted.

A supporting base 32 supports the bell jar 12 and has four legs 32a. An adjustable bolt 33 is provided to a lower end of each leg 32a so as to adjust height of the supporting base 32 and levelness of the bell jar 12.

A motor 35, which acts as a driving unit, is attached to the supporting base 32. A motor shaft of the motor 35 is connected to the rotary shaft 26, so that the motor 35 can rotate the polishing plate 23. In the present embodiment, the motor 35 is provided outside of the bell jar 12, but the motor 35 may be provided in the bell jar 12.

A pressing plate 36 for pressing a work piece (not shown) is provided on the polishing plate 23. The pressing plate 36 applies own weight to the polishing plate 23 as a pressing force. The work piece to be polished is set or sandwiched between the polishing plate 23 and the pressing plate 36.

A plurality of weights 37 are mounted on the pressing plate 36 so as to adjust the pressing force. Note that, number of the weights 37 is optionally determined on the basis of polishing conditions.

A roller 38, which is coaxial with the polishing plate 23, and a roller 39, which is provided above an outer edge of the polishing plate 23, contact an outer edge of the pressing plate 36, so that the pressing plate 36 can be held at a prescribed position on the polishing plate 23. The rollers 38 and 39 are rotatably held by an arc-shaped arm 40 provided in the bell jar 12.

In FIG. 2, the polishing plate 23 is rotated in a direction "A". By rotating the polishing plate 23, the pressing plate 36 too is rotated, about its own axis, in the same direction.

Note that, the roller 38 may be rotated by a motor (not shown) so as to compulsorily rotate the pressing plate 36, which contacts the roller 38, in a prescribed direction.

A proper amount of slurry is stored in the body proper 16. In the present embodiment, a lower part of the body proper 16 acts as a slurry storing section 16b (see FIG. 4).

Figure 4:
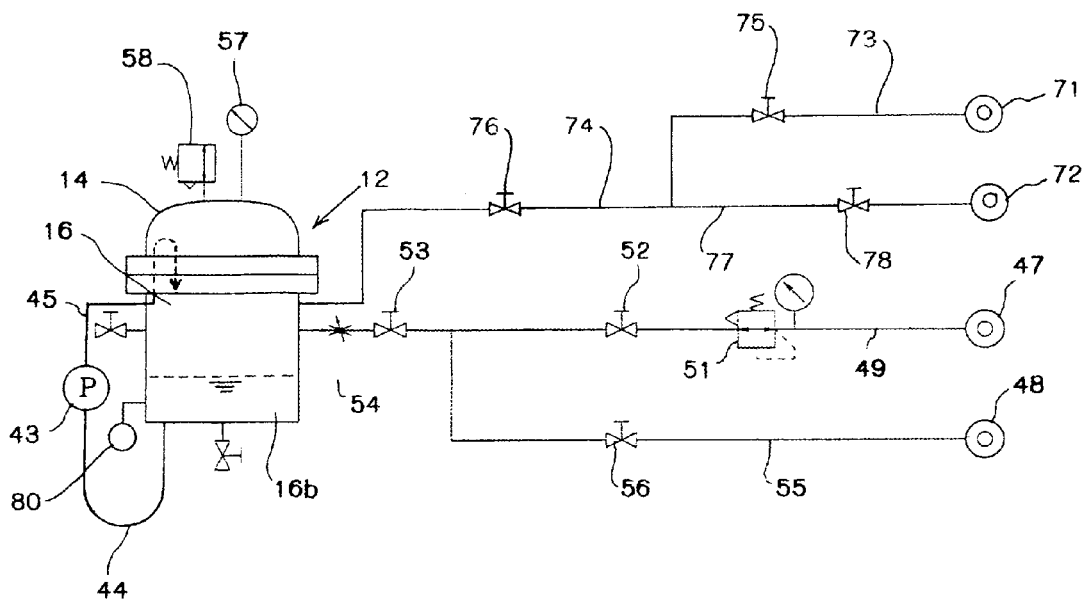
FIG. 4 is an explanation view a pressure source connected to the bell jar.

As shown in FIG. 4, the slurry stored in the body proper 16 is circulated by a circulation pump 43.

The circulation pump 43 is connected to a pipe 44, which is connected to the slurry storing section 16b, and a pipe 45, which is connected to an upper part of the body proper 16. The slurry stored in the slurry storing section 16b is drawn by the pump 43 and supplied onto the polishing plate 23 via the pipe 45. The slurry, which has been used to polish the work piece, is collected in the slurry storing section 16b.

The slurry storing section 16b, the circulation pump 43 and the pipes 44 and 45, etc. constitute a slurry supplying unit. Note that, a symbol 44a shown in FIG. 1 stands for a connecting section of the pipe 44.

The slurry storing section 16b, of course, may be provided outside of the bell jar 12.

In FIG. 4, a symbol 47 stands for a pressurizing unit acts as a pressure source; a symbol 48 stands for a gas discharging section.

The pressurizing unit 47 is connected to the body proper 16 via a pipe 49 so as to introduce a pressurizing gas (fluid) into the bell jar 12. In the present embodiment, air, oxygen, nitrogen, argon, etc. are employed as the pressurizing gasses. Other gasses may be optionally employed. The pressurizing gasses are selected and supplied into the bell jar 12 by a switching valves (not shown). A pressure reduction valve 51 is provided so as to supply the fluid into the bell jar 12 with predetermined pressure. Symbols 52 and 53 are valves, and a symbol 54 is a flow control valve capable of controlling amount of flow of the fluid.

Note that, a mixed gas may be employed as the fluid.

The gas discharging section 48 is connected to a part of the pipe 49, which is located between the valves 52 and 53. A symbol 56 stands for a valve.

The gas discharging section 48 includes a vacuum pump. Note that, a symbol 49a shown in FIG. 1 stands for a connecting section of the pipe 49.

By closing the valve 56 and opening the valves 52 and 53, the pressurized fluid can be introduced into the bell jar 12, so that inner pressure of the bell jar 12 can be increased. On the other hand, by closing the valve 52 and opening the valves 53 and 56, the gas discharging unit 48 sucks the fluid in the bell jar 12, so that the inner pressure of the bell jar 12 can be reduced.

A pressure gauge 57, which acts as a measuring equipment, measures the inner pressure of the bell jar 12. Other equipments for measuring temperature, humidity, etc. may be provided if required.

A safety valve 58 releases the pressurized fluid outside when the inner pressure of the bell jar 12 exceeds a prescribed value. A symbol 60a stands for a viewing window (see FIG. 3).

In FIG. 4, a symbol 71 stands for an ammonia gas bombe, which acts as an alkaline gas supplying source; a symbol 72 stands for a carbonic acid gas bombe, which acts as an acid gas supplying source.

The gas supplying source 71 is connected to the bell jar 12 via pipes 73 and 74. A valve 75 is provided to the pipe 73; a valve 76 is provided to the pipe 74.

The gas supplying source 72 is connected to the bell jar 12 via pipes 74 and 77. A valve 78 is provided to the pipe 77.

By closing the valve 78 and opening the valves 75 and 76, the alkaline gas can be supplied into the bell jar 12 from the gas supplying source 71. On the other hand, by closing the valve 75 and opening the valves 76 and 78, the acid gas can be supplied into the bell jar 12 from the gas supplying source 72.

Note that, by dissolving the alkaline gas and the acid gas in the slurry, a pH value of the slurry can be adjusted.

Other acid gasses, e.g., hydrochloric acid gas, nitric acid gas, may be used in the polishing apparatus.

A pH detecting unit 80 detects the pH value of the slurry in the bell jar 12 or passing through the pipe 44, etc.

Figure 5:
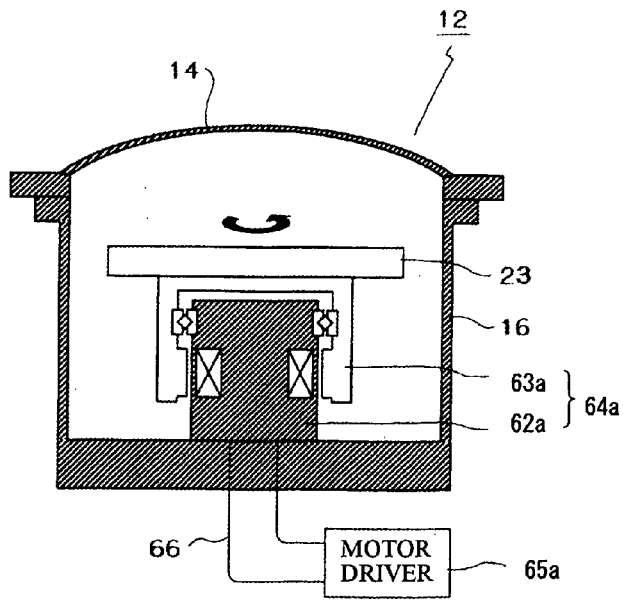
FIG. 5 is an explanation view of a driving unit of another example.

Another example of the driving unit is shown in FIG. 5.

A motor 64a including a stator 62a and a rotor 63a is provided in the bell jar 12, and the polishing plate 23 is fixed on the rotor 63a. A motor driver 65a is provided outside of the bell jar 12, and electric power is supplied to stator coils via wires 66. Note that, the motor 64a is a known electric motor.

In this driving unit, only the wires 66 should be sealed, therefore the sealing mechanism can be simplified.

Figure 6:
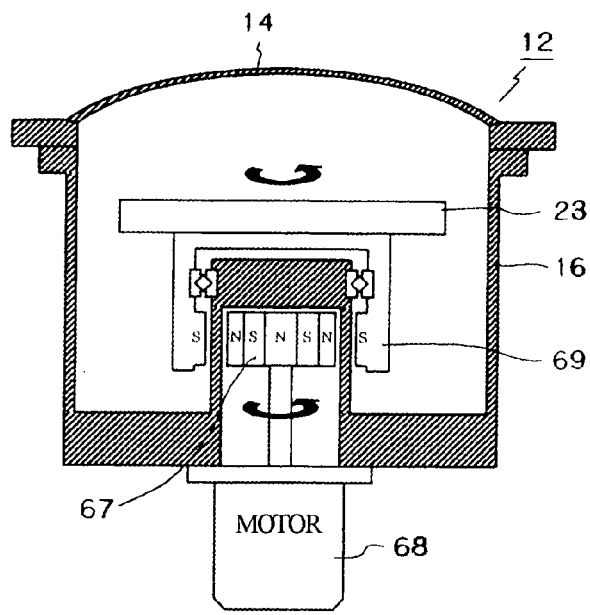
FIG. 6 is an explanation view of the driving unit of other example.

Further, another example of the driving unit is shown in FIG. 6.

In this example, the polishing plate 23 is rotated by magnetic coupler means. Namely, a first magnet rotor 67, in which North magnetic poles and South magnetic poles are alternately formed on an outer circumferential face, is rotated by a motor 68. By rotating the first magnet rotor 67, a second magnet rotor 69 is rotated. The polishing plate 23 is fixed on the second magnet rotor 69.

With this structure, the polishing plate 23 can be rotated without contacting any members located outside, therefore an inner space of the bell jar 12 can be maintained clean.

In the present embodiment, the polishing plate 23 is rotated about its own axis. In another embodiment, the polishing plate 23 may be moved in a plane parallel to a polishing face (the polishing pad) of the polishing plate 23. This embodiment is shown in FIG. 7.

Figure 7:
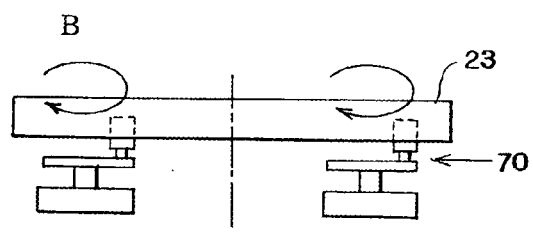
FIG. 7 is an explanation view of a mechanism for moving a polishing plate.

In FIG. 7, a plurality of crank shafts 70 are attached to the polishing plate 23, and the crank shafts 70 are synchronously rotated by a driving unit (not shown), which is provided outside of the bell jar 12. With this structure, the polishing plate 23 can be moved along a circular orbit with fixed heading. Namely, all points in the polishing plate 23 equally rotate in a direction "B".

In the above described embodiment, the work piece is merely pressed onto the polishing plate 23 by the pressing plate 36. The work piece may be adhered on a bottom face of the pressing plate 36. In this case, the polished work piece is peeled from the pressing plate 36 when the polishing is completed.

The pressing member 36 may have sucking means for holding the work piece by producing negative pressure. In this case, the sucking means may suck and hold the work piece directly or with an elastic bucking member.

In the above described embodiment, the weights 37 are employed as the press unit. A cylinder unit (not shown) provided on the arm 40 may be employed to apply pressure to the work piece.

Figure 8:
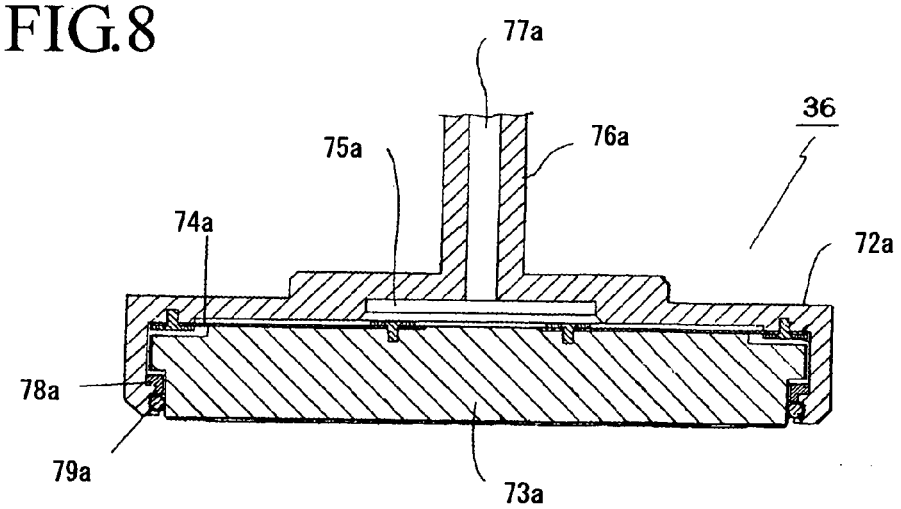
FIG. 8 is a sectional view of a press-type pressing plate.

Further, a pressure head-type pressing plate may be employed. An example of the pressure head-type pressing plate 36 is shown in FIG. 8.

A holding member 73a is suspended in a head proper 72a by an elastic ring member 74a, e.g., diaphragm. With this structure, a pressure chamber 75a is formed. The pressurized fluid is introduced into the pressure chamber 75a, so that the work piece held on a bottom face of the holding member 73a is pressed onto the polishing plate 23. Preferably, the pressing plate 36 is rotated about a rotary shaft 76a by a motor (not shown). A driving mechanism including the motor may be provided on the arm 40.

Further, the pressing plate 36 may be vertically moved by a cylinder unit (not shown) so as to move to and away from the polishing face (the polishing pad) of the polishing plate 23. In this case, the rotary shaft 76a may be rotatably held by a holding arm (not shown), and the holding arm may be vertically moved by a cylinder unit (not shown) provided on the arm 40.

The driving mechanism allows the rotary shaft 76a to vertically move in a prescribed range and transmits torque of the motor.

The pressurized fluid is introduced into the pressure chamber 75a via a fluid path 77a formed in the rotary shaft 76a. The fluid is introduced into the fluid path 77a via a rotary joint (not shown).

A restraining ring 78a prevents the holding member 73a from coming out from the head proper 72a and guides the vertical movement of the holding member 73a.

An O-ring 79a is provided between an inner circumferential face of the head proper 72a and an outer circumferential face of the holding member 73a. The O-ring 79a absorbs horizontal movement of the holding member 73a and prohibits the slurry to enter the head proper 72a.

Experiments were executed in the polishing apparatus 10 under the following conditions. Note that, the inner air pressure of the bell jar 12 was varied; and the copper layer, the $SiO_2$ layer and the Si substrate of the work piece were polished.

The conditions were,
Polishing pad: IC1000/SUBA400 (trade name), diameter 200 mm;
Slurry: silica slurry "SS-25" for $SiO_2$
colloidal silica "Compol-80" for Si
alumina slurry for Copper (no oxidizing agent were added);
Pressing force of the pressing plate 36: 100–500 g/cm$^2$;
Rotational speed of the polishing plate 23: 15–90 rpm; and
Polishing time: 2–4 min.

The work piece were polished with the fixed pressing force, the fixed rotational speed and the fixed polishing time under above conditions. The results are shown in FIG. 9.

Figure 9:
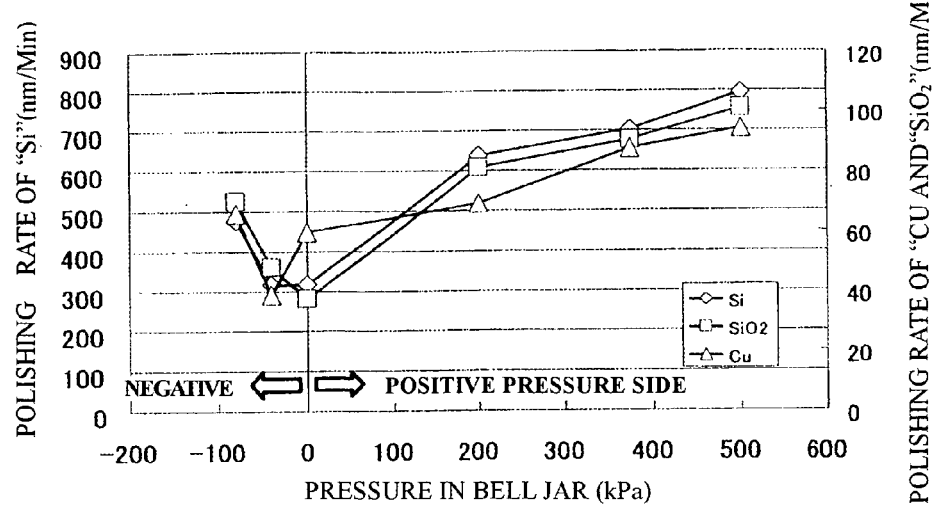
FIG. 9 is a graph showing a relationship between air pressure and polishing rate.

In FIG. 9, the inner pressure of zero is the atmospheric pressure. Namely, the horizontal axis or the inner pressure of the bell jar 12 indicates the pressure added to and reduced from the atmospheric pressure.

As clearly shown in FIG. 9, polishing rate under the atmospheric pressure was minimum; the polishing rate was increased in nearly proportion to increasing and reducing the inner pressure.

Especially, in the case of polishing the $SiO_2$ layer and the Si substrate, the polishing rate of 200 kPa was about twice as great as that of the atmospheric pressure; and the polishing rate of 500 kPa was about 2.5 times as great as that of the atmospheric pressure.

In case of polishing the copper layer, the minimum polishing rate appeared on the negative pressure side (about −50 kPa). Namely, the minimum polishing rate was slightly shifted toward the negative pressure side, but the polishing rate was increased on the both sides of the minimum as well as the $SiO_2$ layer and the Si substrate.

The inventor thinks that the reasons of increasing the polishing rate under the positive pressure are: the fluid pressure is applied to the pressing plate 36; and the slurry is permeated into the polishing pad by the fluid pressure.

The reason of increasing the polishing rate under the negative pressure is not clearly found. The inventor thinks that frictional heat between the work piece and the polishing pad is hardly radiated due to pressure reduction in the bell jar 12 so that temperature rises and reaction rate is increased. By increasing the reaction rate, the polishing rate is increased under the negative pressure.

Figure 10:
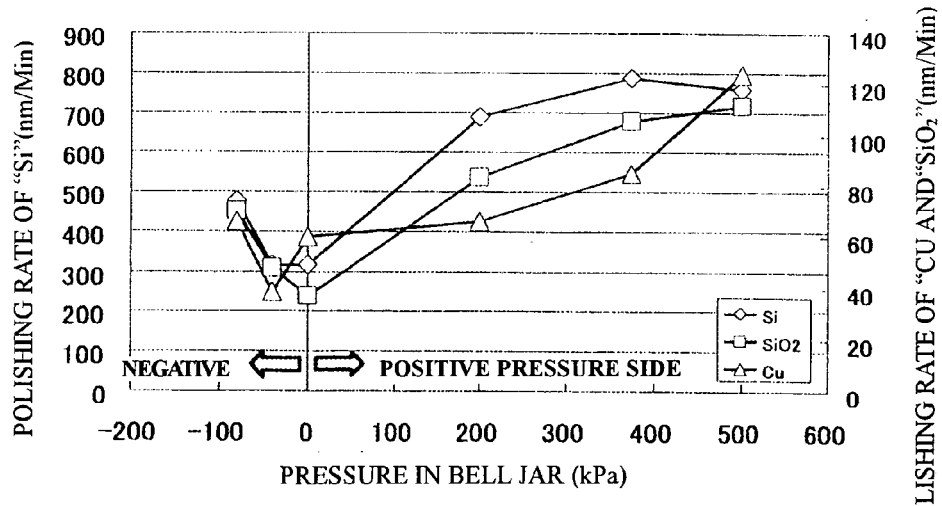
FIG. 10 is a graph showing a relationship between oxygen gas pressure and polishing rate.

FIG. 10 is a graph showing a relationship between oxygen gas pressure and the polishing rate. Oxygen was used as the fluid instead of the air.

Tendency of the case of employing oxygen is nearly equal to that of the case employing the air. Especially, in the case of polishing the copper layer, the polishing rate was much increased under high pressure.

According to the results, the polishing rate can be controlled by adjusting the inner pressure of the bell jar 12 without changing other conditions.

For example, when the polishing is started and the work piece is roughly polished, the inner pressure of the bell jar 12 is increased or reduced so as to polish the work piece with high polishing rate; when the work piece is finished and the work piece, the inner pressure of the bell jar 12 is returned to zero or the atmospheric pressure so as to polish the work piece with low polishing rate.

Of course, the polishing rate may be controlled by combining other factors, e.g., the rotational speed of the polishing plate 23.

In case of using a plurality of kinds of slurry or polishing pads, a plurality of polishing stations are provided in one polishing apparatus, so that the polishing apparatus must be large. However, the inner pressure of the bell jar 12 and the rotational speed of the polishing plate 23 can be changed at one polishing station, so number of the polishing stations can be reduced, the polishing conditions can be easily determined, a size of the polishing apparatus can be smaller and manufacturing cost of the apparatus can be reduced.

The slurry accommodated in the bell jar 12 is pressurized and circulated, so load of the circulation pump 43 is not so great.

If the slurry storing section is provided outside of the bell jar 12, the slurry is introduced into the bell jar 12 whose inner pressure has been increased, so that a high power circulation pump is required.

The slurry may stay in the bell jar 12. In this case, the polishing plate 23 is inclined with respect to the horizontal plane, by adjusting the adjustable bolts 33, so as to dip a lower part of the surface of the polishing plate 23 in the slurry. With this structure, the slurry can be always permeated into the polishing pad for polishing the work piece.

Next, adjusting a-pH value of the slurry will be explained.

Note that, the adjustment of the pH value and the adjustment of the inner pressure of the bell jar 12 may be executed separately or simultaneously.

Figure 11:
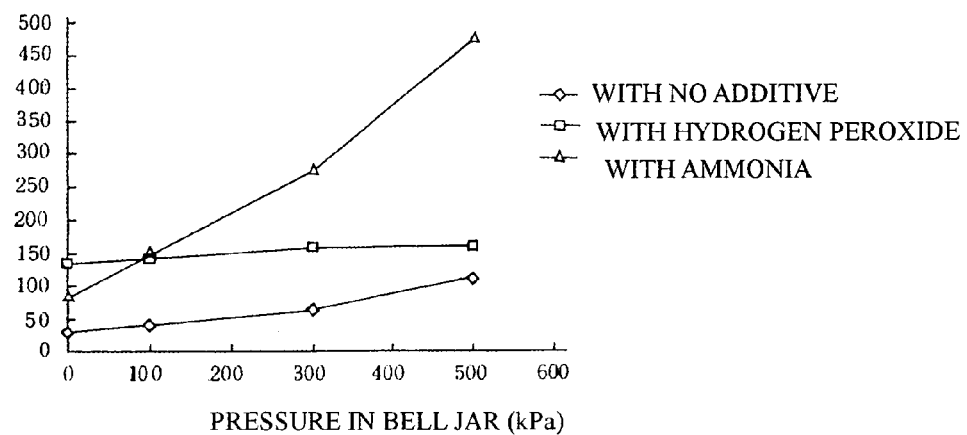
FIG. 11 is a graph showing a relationship between inner pressure of the bell jar, pH values of slurry and polishing rate.

FIG. 11 shows polishing efficiency with slurry "CU-5001 (trade name of Cabot Colo., USA)".

The slurry is usually used for polishing copper, its pH value is about 7, and a proper amount of hydrogen peroxide is usually added to the slurry.

Experiments were performed with (1) the slurry with hydrogen peroxide, (2) the slurry with no hydrogen peroxide and (3) the slurry with no hydrogen peroxide but an alkaline liquid, e.g., aqua ammonia, was added to increase the pH value to about 10. The bell jar 12 was pressurized by an oxygen gas, and copper layers were polished with the slurry (1)–(3). The results are shown in FIG. 11.

In FIG. 11, the inner pressure of 0 kpa is the atmospheric pressure. Namely, the horizontal axis or the inner pressure of the bell jar 12 indicates the pressure added to and reduced from the atmospheric pressure. On the other hand, the vertical axis indicates relative polishing rate.

As clearly shown in FIG. 11, the polishing rate of the slurry with hydrogen peroxide was 2–3 times greater than that with no hydrogen peroxide; the polishing rate of the slurry with hydrogen peroxide was not increased by increasing and reducing the inner oxygen gas pressure of the bell jar 12.

In case of the slurry to which the alkaline liquid was added, dependence on the inner pressure of the bell jar 12 was very high, and the polishing rate of the slurry to which the alkaline liquid was added was 3–4 times greater than that with hydrogen peroxide.

According to the results, the polishing rate of slurry highly depends on the pH value and the inner pressure of the bell jar 12. Therefore, the polishing rate can be controlled by adjusting the pH value of the slurry and the inner pressure of the bell jar 12.

Figure 12:
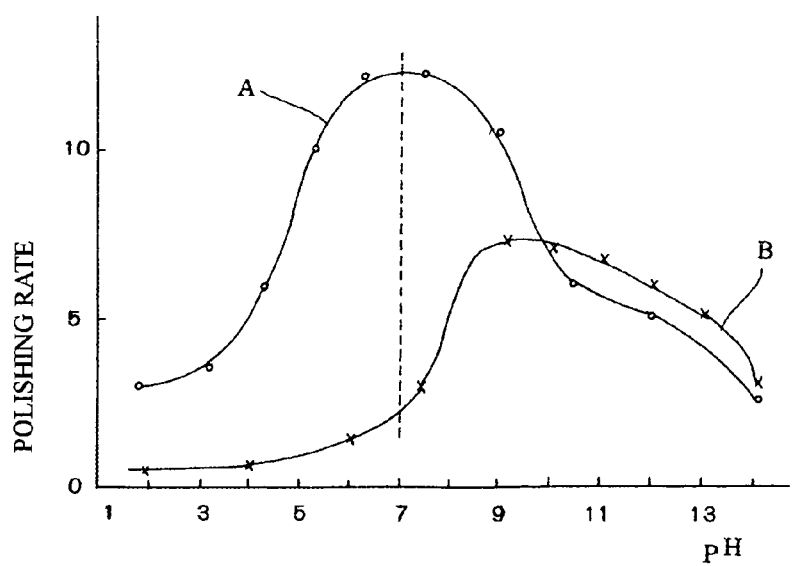
FIG. 12 is a graph showing a relationship between pH values of the slurry and polishing rate.

FIG. 12 shows a relationship between polishing rate of ordinary slurry for polishing $SiO_2$ film, glass, quartz, etc. and pH value of the slurry. Note that, the inner space of the bell jar 12 was not pressurized during the experiments. A graph "A" was the slurry including ceria (cerium) grains; a graph "B" was the slurry including silica ($SiO_2$) grains. Maximum polishing rate of the ceria slurry was observed when the pH value was about 7, and the polishing rate thereof was reduced on the alkaline side and the acid side. On the other hand, maximum polishing rate of the silica slurry was observed when the pH value was 9–10.

Figure 13:
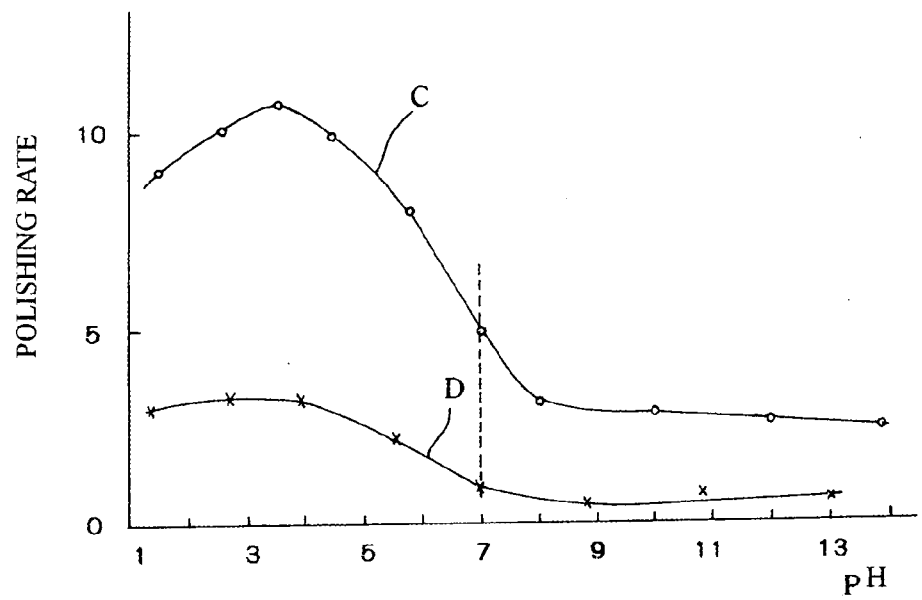
FIG. 13 is a graph showing a relationship between pH values of the slurry and polishing rate.
Figure 14:
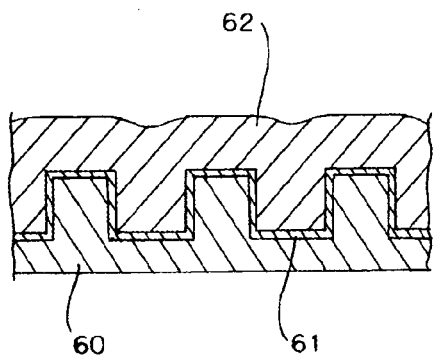

FIG. 13 shows a relationship between polishing rate of slurry for polishing copper, tantalum, tantalum nitride, etc. and pH value of the slurry. Note that, the inner space of the bell jar 12 was not pressurized during the experiments. A graph "C" was the slurry for polishing copper, and maximum polishing rate was observed when the pH value was about 3–4 (the acid side). Note that, the slurry was different from the Cabot slurry of FIG. 11. On the other hand, a graph "D" was the slurry for polishing tantalum and tantalum nitride, and maximum polishing rate was observed when the pH value was about 3–4 (the acid side). Tantalum and tantalum nitride are very hard substances, so the polishing rate of the slurry for polishing tantalum and tantalum nitride was much lower than that of the slurry for polishing copper.

The slurry of FIGS. 12 and 13 are usually selectively used according to work pieces to be polished.

As described above, a work piece or work pieces are polished in the closed bell jar 12.

Since the bell jar 12 is air-tightly closed, the pH value of the slurry in the bell jar 12 can be changed in real time by supplying the alkaline gas or the acid gas from the gas supplying source 71 or 72. Note that, the gas in the bell jar 12 can be discharged by the gas discharging section 48.

The pH value of the slurry can be changed by the alkaline gas and the acid gas because the bell jar 12 is air-tightly closed. Namely, the slurry in the bell jar 12 is not influenced by external atmospheric conditions. Since the pH value of the slurry can be changed in real time, the polishing rate can be changed without changing slurry. Namely, various kinds of polishing can be executed with the same slurry. The polishing rate may be controlled by changing the pH value without changing pressure of the pressurizing gas in the bell jar 12. Further, as suggested in FIG. 11, the polishing rate may be controlled by changing the pH value and the pressure of the pressurizing gas in the bell jar 12.

An example of the control of the polishing rate will be explained with reference to FIGS. 14–17. FIGS. 14–17 show a process of implanting copper cables coated with a $SiO_2$ film 60 in a substrate.

A barrier metal layer 61 prevents copper 62 from diffusing in the $SiO_2$ film 60. The barrier metal layer 61 is formed by spattering tantalum nitride (TaN) or tantalum (Ta). The copper layer 62 is formed by, for example, electrolytic copper plating.

Figure 15:
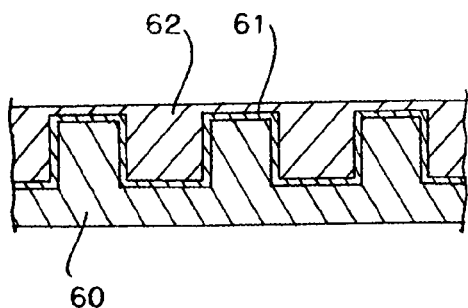

Firstly, as shown in FIG. 15, the copper layer 62 is polished close to the barrier metal layer 61 with slurry, e.g., the slurry "C" of FIG. 13. When the copper layer 62 is polished, the inner air pressure of the bell jar 12 is highly increased and the pH value is adjusted about 3. Therefore, the copper layer 62 can be polished with high polishing rate.

Figure 16:
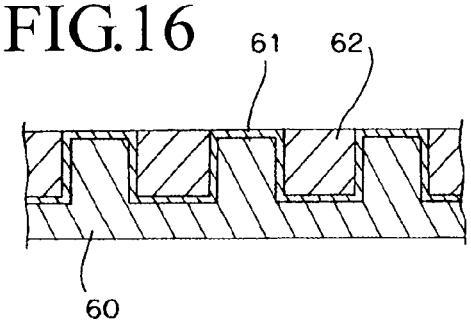
Figure 17:
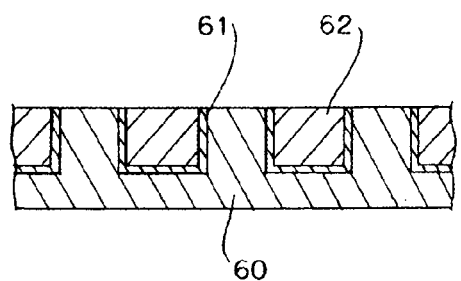
Figure 18:
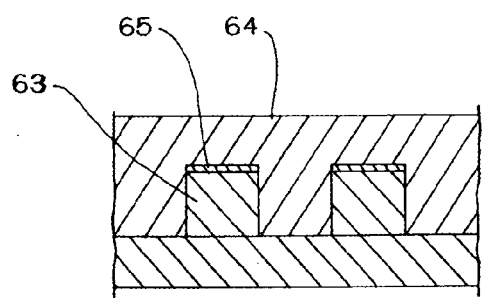
Figure 19:
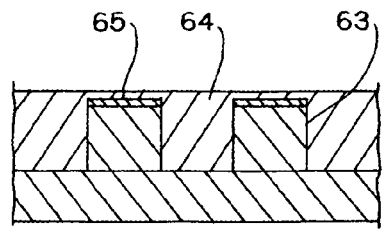

Next, as shown in FIG. 16, the copper layer 62 is further polished, with moderate polishing rate, until the barrier metal layer 61 is exposed. In this polishing process, the inner pressure of the bell jar 12 is slightly reduced to moderate pressure, then the ammonia gas is introduced into the bell jar 12 to make the pH value of the slurry about 6. If this polishing process is executed with high polishing rate, the copper layer 62, which is softer than the barrier metal layer 61, is over-polished so that flatness of the polished surface is lowered.

Finally, the inner pressure of the bell jar 12 is returned to the atmospheric pressure, and the pH value of the slurry is increased to 7 or 8 by supplying the ammonia gas into the bell jar 12. Top parts of the barrier metal layer 61 are removed by polishing with lower polishing rate. With this process, the implanted cables can be formed with high flatness (see FIG. 17).

FIGS. 18–21 show an example of polishing a $SiO_2$ film 64 formed on copper cables 63. Note that, a symbol 65 stands for stop layers made of, for example, tantalum nitride.

For example, the slurry "A" of FIG. 12 is used for polishing, the pH value of the slurry is about 7, the inner pressure of the bell jar 12 is increased by supplying air, and the $SiO_2$ film 64 is efficiently polished close to the stop layers 65 (see FIG. 19) with high polishing rate.

Figure 20:
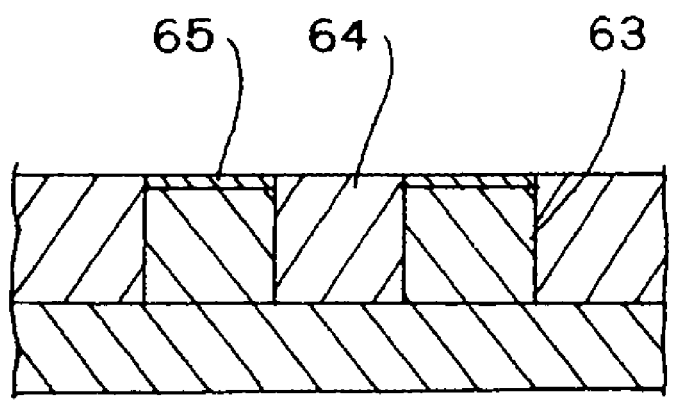
Figure 21:
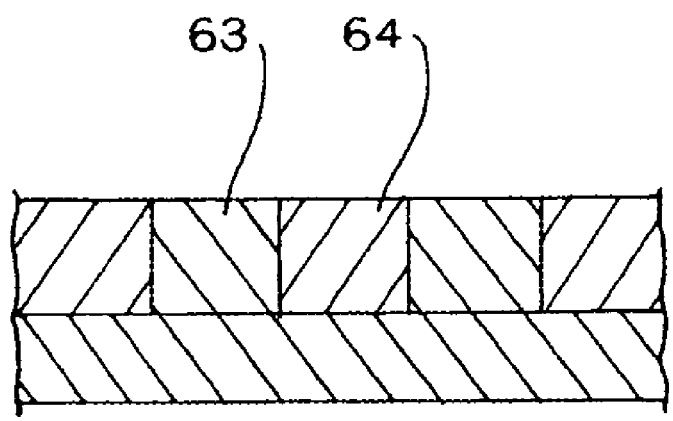

Next, as shown in FIG. 20, the $SiO_2$ film 64 is further polished, with moderate polishing rate, until the stop layers 65 are exposed. In this polishing process, the inner pressure of the bell jar 12 is slightly reduced to moderate pressure, then the carbonic acid gas is introduced into the bell jar 12 to make the pH value of the slurry about 5.

Finally, the pH value of the slurry is adjusted about 3 by further supplying the carbonic acid gas into the bell jar 12, and the inner pressure of the bell jar 12 is returned to the atmospheric pressure. The stop layers 65 are removed by polishing with lower polishing rate. With this process, the implanted cables can be formed with high flatness (see FIG. 21).

As described above, the work piece can be highly efficiently polished in the same bell jar 12 without exchanging the slurry.

Figure 22:
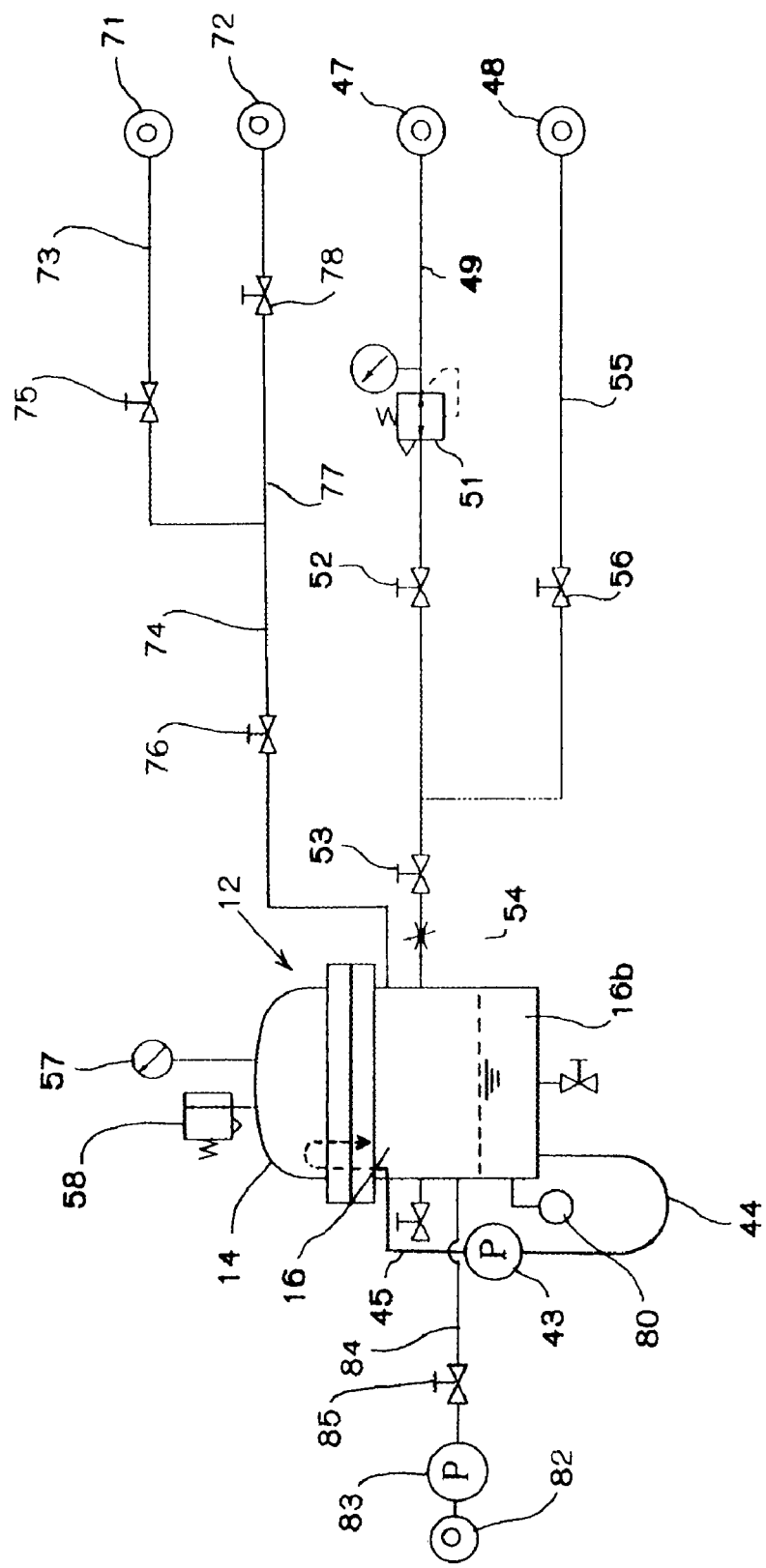
FIG. 22 is an explanation view of another embodiment.

Another embodiment of the polishing apparatus 10 is shown in FIG. 22. The structural elements shown in FIG. 4 are assigned the same symbols and explanation will be omitted.

In this embodiment, pure water is used as slurry, and the alkaline gas and the acid gas are supplied into the pure water so as to adjust the pH value of the slurry (water).

The pure water is stored in a pure water source 82, e.g., tank. The pure water is supplied into the body proper 16 of the bell jar 12 from the pure water source 82 by a pump 83 via a pipe 84. A valve 85 is provided to the pipe 84.

A method of preparing the slurry in the body proper 16 will be explained.

Firstly, a suitable amount of pure water is supplied into the body proper 16 from the pure water source 82. Note that, in case of preparing slurry including polishing grains, a suitable amount of polishing grains are also supplied into the body proper 16 from a grain supplying section (not shown). For example, in case of polishing copper film, no polishing grains are required.

In the polishing apparatus 10 of the present embodiment, the alkaline slurry or the acid slurry is selected according to work pieces to be polished. The pH value of the slurry is easily adjusted by supplying the alkaline gas or the acid gas into the body proper 16 from the gas supplying source 71 or 72. Namely, the pH value is adjusted by solely dissolving the alkaline gas or the acid gas in the pure water. Since the bell jar 12 can be air-tightly closed, the pH value can be easily adjusted. Amount of supplying the alkaline gas or the acid gas can be adjusted by detecting the pH value of the slurry with the pH detecting unit 80.

Further, polishing grains may be supplied into the slurry if required.

In the present embodiment too, the pH value of the slurry in the bell jar 12 can be adjusted in real time. Therefore, the polishing processes shown in FIGS. 14–17 and FIGS. 18–21 can be executed.

Firstly, the process of polishing implanting copper cables coated with a $SiO_2$ film 60 will be explained with reference to FIGS. 14–17.

The barrier metal layer 61 prevents the copper layer 62 from diffusing in the $SiO_2$ film 60. The barrier metal layer 61 is formed by spattering tantalum nitride (TaN) or tantalum (Ta). The copper layer 62 is formed by, for example, electrolytic copper plating.

To polish the copper layer 62, the pure water and the acid gas are supplied into the body proper 16 so as to make the slurry whose pH value is about 3. As described above, polishing grains may be supplied if required.

As shown in FIG. 15, the copper layer 62 is polished close to the barrier metal layer 61 with this slurry. When the copper layer 62 is polished, the inner air pressure of the bell jar 12 is highly increased and the pH value is adjusted about 3. Therefore, the copper layer 62 can be polished with high polishing rate.

Next, as shown in FIG. 16, the copper layer 62 is further polished, with moderate polishing rate, until the barrier metal layer 61 is exposed. In this polishing process, the inner pressure of the bell jar 12 is slightly reduced to moderate pressure, then the ammonia gas is introduced into the bell jar 12 to make the pH value of the slurry about 6. If this polishing process is executed with high polishing rate, the copper layer 62, which is softer than the barrier metal layer 61, is over-polished so that flatness of the polished surface is lowered.

Finally, the inner pressure of the bell jar 12 is returned to, for example, the atmospheric pressure, and the pH value of the slurry is increased to 7 or 8 by supplying the ammonia gas into the bell jar 12. Top parts of the barrier metal layer 61 are removed by polishing with lower polishing rate. With this process, the implanted cables can be formed with high flatness (see FIG. 17).

In this process, the acid slurry is firstly prepared, then the ammonia gas is supplied to the acid slurry. Therefore, salt is formed in the slurry by neutralization, but the salt does not badly influence the polishing.

As described above, the implanted copper cables can be polished.

To newly execute another polishing process, the slurry is completely drained from the bell jar 12, the polishing pad is cleaned with pure water, then new slurry is prepared. In the present embodiment, the slurry is formed by merely dissolving the alkaline component or the acid component in the pure water. Polishing grains may be included if required. Therefore, the polishing pad can be easily cleaned, and the new slurry can be prepared in a very short time.

Therefore, a cycle time of the polishing process can be shortened, and the polishing efficiency can be improved.

Successively, another example of polishing the $SiO_2$ film 64 formed on copper cables 63 will be explained with reference to FIGS. 18–21. Note that, the symbol 65 stands for stop layers made of, for example, tantalum nitride.

As described above, a suitable pH value of the slurry for polishing the $SiO_2$ film 64 is about 7. Slurry is prepared by supplying the pure water into the body proper 16. The $SiO_2$ film 64 can be well polished by the slurry including polishing grains, so polishing grains may be supplied into the slurry from the grain supplying section.

To polish the $SiO_2$ film 64 close to the stop layers 65 (see FIG. 19) with this slurry, the inner pressure of the bell jar 12 is increased by supplying air, and the $SiO_2$ film 64 is efficiently polished with high polishing rate.

Next, as shown in FIG. 20, the $SiO_2$ film 64 is further polished, with moderate polishing rate, until the stop layers 65 are exposed. In this polishing process, the inner pressure of the bell jar 12 is slightly reduced to moderate pressure, and the carbonic acid gas is introduced into the bell jar 12 to make the pH value of the slurry about 5.

Finally, the pH value of the slurry is adjusted about 3 by further supplying the carbonic acid gas into the bell jar 12, and the inner pressure of the bell jar 12 is returned to, for example, the atmospheric pressure. The stop layers 65 are removed by polishing with lower polishing rate. With this process, the implanted cables can be formed with high flatness (see FIG. 21).

As described above, the work piece can be highly efficiently polished in the same bell jar 12 without exchanging the slurry.

When another polishing process is executed, the slurry may be completely exchanged. In this case too, the slurry can be easily prepared.

In the present invention, a neutral gas, e.g., ozone, oxygen, hydrogencarbonate gas, may be supplied into the bell jar 12, as a gas for preparing the slurry, instead of the alkaline gas and the acid gas. In this case, the neutral gas is not supplied from the gas supplying sources 71 and 72, but it may be supplied from the pressurizing unit 47, as the gas for preparing the slurry and for increasing the inner pressure of the bell jar 12.

The invention may be embodied in other specific forms without departing from the spirit or essential characteristics thereof. The present embodiments are therefore to be considered in all respects as illustrative and not restrictive, the scope of the invention being indicated by the appended claims rather than by he foregoing description and all changes which come within the meaning and range of equivalency of the claims are therefore intended to be embraced therein.

The invention claimed is:

1. A polishing apparatus, comprising:
   a pressure vessel having a lid which opens or closes said pressure vessel;
   a polishing plate being provided in said pressure vessel;

a pressing plate being provided on said polishing plate, said pressing plate pressing a work piece, which has been set between said polishing plate and said pressing plate, onto said polishing plate;

a driving unit moving said polishing plate relative to said pressing plate so as to polish the work piece;

a gas supplying source being connected to said pressure vessel, said gas supplying source supplying an alkaline gas or an acid gas into said pressure vessel;

a gas discharging section discharging the supplied gas from said pressure vessel; and a pure water supplying unit supplying pure water onto said polishing plate; and a pH detecting unit for detecting the pH value of the pure water, wherein a pH value of the pure water is adjusted by dissolving the alkaline gas or the acid gas in the pure water so as to use the pure water as slurry.

2. The polishing apparatus according to claim 1, further comprising a pressure source for supplying a pressurizing gas into said pressure vessel and removing said pressurizing gas out of said pressure vessel so as to increase or reduce the inner pressure of said pressure vessel, said pressurizing gas being different from the alkaline gas and the acid gas.

3. A method of polishing a work piece in a polishing apparatus comprising:

providing a pressure vessel having a lid which opens or closes said pressure vessel;

providing a polishing plate in said pressure vessel;

providing a pressing plate on said polishing plate;

pressing a work piece onto said polishing plate with said pressing plate, said work piece being set between said polishing plate and said pressing plate;

providing a driving unit moving said polishing plate relative to said pressing plate so as to polish the work piece;

providing a gas supplying source connected to said pressure vessel, said gas supplying source supplying an alkaline gas or an acid gas into said pressure vessel;

providing a gas discharging section to discharge the supplied gas from said pressure vessel;

providing a pure water supplying unit to supply pure water onto said polishing plate;

providing a pH detecting unit for detecting the pH value of the pure water;

adjusting the pH value of the pure water by supplying the alkaline gas or the acid gas into said pressure vessel from said gas supplying source and using the pure water as slurry; and detecting the pH value of the pure water with the pH detecting unit.

4. The method according to claim 3, further comprising supplying with a pressure source a pressurizing gas into said pressure vessel or removing with said pressure source said pressurizing gas out of said pressure vessel so as to increase or decrease an inner pressure of said pressure vessel, said pressurizing gas being different from the alkaline gas and the acid gas.

* * * * *